(12) United States Patent
Hammer et al.

(10) Patent No.: US 9,806,247 B2
(45) Date of Patent: Oct. 31, 2017

(54) GAS TURBINE ARRANGEMENT, POWER PLANT AND METHOD FOR THE OPERATION THEREOF

(75) Inventors: Thomas Hammer, Hemhofen (DE); Stefan Lampenscherf, Poing (DE); Gia Khanh Pham, Charlotte, NC (US); Andreas Pickard, Adelsdorf (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 566 days.

(21) Appl. No.: 14/236,555

(22) PCT Filed: Aug. 8, 2012

(86) PCT No.: PCT/EP2012/065493
§ 371 (c)(1),
(2), (4) Date: Mar. 7, 2014

(87) PCT Pub. No.: WO2013/026702
PCT Pub. Date: Feb. 28, 2013

(65) Prior Publication Data
US 2014/0174097 A1    Jun. 26, 2014

(30) Foreign Application Priority Data

Aug. 25, 2011  (DE) .................. 10 2011 081 565

(51) Int. Cl.
*H01L 35/30* (2006.01)
*F01D 15/10* (2006.01)
*F02C 6/18* (2006.01)

(52) U.S. Cl.
CPC .............. *H01L 35/30* (2013.01); *F01D 15/10* (2013.01); *F02C 6/18* (2013.01); *F05D 2220/64* (2013.01); *F05D 2220/76* (2013.01)

(58) Field of Classification Search
CPC ......... H01L 35/00; H01L 35/28; H01L 35/30; H01L 35/32; F02C 6/18; F02C 3/04
See application file for complete search history.

(56) References Cited

U.S. PATENT DOCUMENTS

| 3,719,532 A | 3/1973 | Falkenberg |
| 5,550,410 A | 8/1996 | Titus |

(Continued)

FOREIGN PATENT DOCUMENTS

| DE | 1149573 B | 5/1963 |
| DE | 1476854 A1 | 10/1969 |

(Continued)

*Primary Examiner* — Carlos A Rivera
(74) *Attorney, Agent, or Firm* — Beusse Wolter Sanks & Maire

(57) ABSTRACT

A gas turbine arrangement, a power plant having such a gas turbine arrangement and a method for operating the power plant are provided. A compressor may be mechanically coupled to a turbine which can be driven by combustion gases, such as can be generated by combustion of fuel with the compressed combustion air. An exhaust system may be used to discharge the combustion gases. One or more thermoelectric generators may be thermally coupled to the exhaust system for generating electrical energy from residual heat of the combustion gases which pass in the exhaust system. This gas turbine arrangement allows waste heat from the combustion gases to be utilized and thus the overall efficiency of the gas turbine arrangement can be increased and pollutant emissions may be lowered.

15 Claims, 4 Drawing Sheets

(56) References Cited

U.S. PATENT DOCUMENTS

| | | | |
|---|---|---|---|
| 6,951,456 B2* | 10/2005 | Cohen | F28D 9/04 110/204 |
| 7,228,887 B2* | 6/2007 | Chen | H01L 23/3672 165/185 |
| 2003/0178181 A1* | 9/2003 | Noda | F28F 3/02 165/80.3 |
| 2003/0188848 A1* | 10/2003 | Kuo | F28F 3/02 165/80.3 |
| 2004/0045594 A1 | 3/2004 | Hightower | |
| 2005/0022855 A1* | 2/2005 | Raver | F02C 6/18 136/205 |
| 2005/0072454 A1* | 4/2005 | Cohen | F28D 9/04 136/205 |
| 2006/0101822 A1 | 5/2006 | Murata | |
| 2011/0283712 A1* | 11/2011 | Brillet | B64D 41/00 60/801 |
| 2012/0031067 A1* | 2/2012 | Sundaram | F01D 25/30 60/39.01 |
| 2012/0118345 A1* | 5/2012 | Stoia | F01D 5/284 136/205 |
| 2012/0174567 A1* | 7/2012 | Limbeck | F01N 5/025 60/320 |

FOREIGN PATENT DOCUMENTS

| | | |
|---|---|---|
| DE | 102009033613 A1 | 1/2011 |
| FR | 2942077 A1 | 8/2010 |
| JP | H2238104 | 9/1990 |
| JP | H11289783 | 10/1999 |
| JP | 2002238272 A | 8/2002 |
| JP | 2002325470 A | 11/2002 |
| JP | 2004208476 A | 7/2004 |
| JP | 2004343898 A | 12/2004 |
| JP | 2006271163 A | 10/2006 |
| JP | 2008232086 A | 10/2008 |
| JP | 2009293390 A | 12/2009 |
| JP | 2010057335 A | 3/2010 |
| JP | 2012039858 A | 2/2012 |
| WO | 2010089505 A1 | 8/2010 |

* cited by examiner

GAS TURBINE ARRANGEMENT, POWER PLANT AND METHOD FOR THE OPERATION THEREOF

CROSS REFERENCE TO RELATED APPLICATIONS

This application is the U.S. National Stage of International Application No. PCT/EP2012/065493 filed Aug. 8, 2012, and claims the benefit thereof. The International Application claims the benefit of German Application No. DE 102011081565.1 filed Aug. 25, 2011. All of the applications are incorporated by reference herein in their entirety.

FIELD OF THE INVENTION

The invention relates to a gas turbine arrangement, to a power plant having such a gas turbine arrangement and to a method for operating a power plant.

BACKGROUND OF INVENTION

In gas turbine power plants, fuel, for example natural gas, is burnt in a gas turbine and drives a generator for current generation. Gas turbine power plants, although having lower efficiency than gas and steam turbine power plants, are especially cost-effective and flexible. What is particularly important in this context is the short start-up time of such a power plant which can go from standstill to full-load operation in a few minutes. Gas turbine power plants are therefore suitable especially as standby plants and for covering load peaks in the power network.

Presently, gas turbine power plants achieve an efficiency of 35%-40%, that is to say 60%-65% of primary energy is lost as waste heat. The use of waste heat utilization methods known from gas and steam turbine power plants, such as, for example, the use of waste heat steam generators, is ruled out because these would increase the starting time of the gas turbine power plant and entail considerable investment costs.

Therefore, it is desirable to provide a gas turbine arrangement, a power plant having such a gas turbine arrangement and a method for the operation of such a turbine, all of which enable a gas turbine to be operated with increased efficiency without any restriction in flexibility and cost effectiveness.

SUMMARY OF INVENTION

Such a gas turbine arrangement comprises a compressor for compression of combustion air, which compressor is coupled mechanically to a turbine via a shaft. Combustion gases capable of being generated as a result of the combustion of fuel with the compressed air drive the turbine and are discharged into the surroundings via an exhaust gas tract. According to aspects of the invention, there is in this case provision whereby at least one thermoelectric generator is arranged in the exhaust gas tract.

Thermoelectric generators, by the combined action of the Peltier effect and Seebeck effect, convert a heat flow conducted through them directly into electrical direct current. The gas turbine arrangement according to aspects of the invention thus makes it possible to recover energy from the waste heat of the exhaust gas and consequently to increase the overall efficiency of the gas turbine arrangement. Since more utilizable electrical energy can be provided at the same amount of fuel used, the gas turbine arrangement according to aspects of the invention also has reduced $CO_2$ emissions, as compared with the prior art, and is therefore especially environmentally and climate friendly.

Moreover, since the exhaust gas temperature is lowered by utilizing the residual heat of the exhaust gas, the gas turbine arrangement according to aspects of the invention also makes it possible to use catalytic exhaust gas treatment plants following the thermoelectric generator in the exhaust gas tract, for example in accordance with the method of selective catalytic reduction. This, too, contributes to the especial environmental friendliness of the subject of the invention.

On account of the particularly short start-up times of thermoelectric generators, furthermore, the flexibility of the gas turbine arrangement is not impaired by this type of waste heat utilization, but therefore the gas turbine arrangement according to aspects of the invention is especially suitable for use in standby and peak load power plants.

Moreover, waste heat utilization by means of thermoelectric generators manages without movable parts and without additional, possibly toxic or combustible operating media and is therefore especially low-maintenance and wear-resistant. Since thermoelectric generators can also be constructed in a modular fashion, it is also possible to have easy scaling with regard to the exhaust gas quantity to be utilized and also with regard to the exhaust gas temperature.

Since thermoelectric generators have a defined working direction, it is expedient to arrange the generators such that their hot side, that is to say that side on which heat occurs during generator operation, is coupled thermally to the flow duct for the combustion gases. By contrast, the cold side preferably faces a coolant line and is coupled thermally to this. By the active cooling of the cold side, an especially steep thermal gradient is achieved via the thermoelectric generator and efficiency is consequently improved.

For a further improvement in efficiency, it is advantageous to provide heat transmission elements for the thermal coupling of the hot side to the combustion gases. These may be, for example, ribs or similar structures for surface enlargement. Consequently, an especially large quantity of heat can be extracted from the stream of combustion gases and used for the thermoelectric generation of electrical energy.

Furthermore, heat transmission elements of this type can be utilized advantageously in order to set the working temperature of the thermoelectric generator to its optimal operating point.

In particular, it is advantageous if, by the suitable dimensioning of the contact surfaces, the heat conductivity on a surface of the heat transmission element which faces the flow duct (that is to say, between the free exhaust gas flow and the facing outer surface of the heat transmitter) is lower than the heat conductivity on a side of the heat transmission element which faces the assigned thermoelectric generator (that is to say, between the outer and the inner surface). What is thereby achieved is that a substantial part of the required temperature difference in the convective transport of heat is achieved in the flow boundary layer of the combustion gas. It can consequently be ensured, even in the case of very hot combustion gases, that the maximum permissible operating temperature of the thermoelectric generator is not overshot.

The surface ratios between the heat transmission element and the hot side of the thermoelectric generator are in this case expediently designed in terms of the average gas temperature along the extent of the thermoelectric generator on account of the thermal conductivity of the heat transmission element there is then temperature equalization over the entire surface, so that even local overheating of the thermoelectric generator is avoided.

It is especially advantageous for the accurate setting of the heat flows during the operation of the gas turbine arrangement to have a modular configuration in which a plurality of thermoelectric generators are arranged one behind the other in the flow direction of the combustion gases. This makes it possible to set the thermal ratios individually for each one of the thermoelectric generators. In this case, it is especially expedient to decouple the thermoelectric generators thermally from one another.

Furthermore, in such an arrangement, it is advantageous if, for thermoelectric generators which are in each case adjacent, the thermoelectric generator in front in the flow direction has a lower ratio between that surface of the assigned heat transmission element which faces the gas stream and the surface of the hot side of the thermoelectric generator than the thermoelectric generator in the rear in the flow direction. The cooling of the gas stream can consequently be allowed for by the transmission of heat to the thermoelectric generator, so that each thermoelectric generator can be operated at its optimal operating point independently of its position.

In a preferred embodiment of the invention, the at least one thermoelectric generator surrounds the coolant line on the outer circumference. It is especially expedient if the thermoelectric generator is arranged on the outer circumferential surface of a coolant line having a round cross section. Thus, in other words, the thermoelectric generator is integrated into a tube heat exchanger arranged in the exhaust gas stream. This is an especially simple and robust arrangement. In this embodiment, the thermoelectric generator can, for example, be manufactured especially simply by alternating p-doped and n-doped semiconductor elements being sprayed onto the tube circumference.

Alternatively, plate-shaped thermoelectric generator modules may also be employed. Modules of this type may, for example, be arranged such that the coolant line is designed as a gap between opposite pairs of plate-shaped thermoelectric generators. By virtue of the sandwich-like type of construction, the modules are in each case acted upon in pairs by cooling medium at the same temperature, thus allowing especially efficient cooling. At the same time, this embodiment makes it possible to use modules in conventional flat format, which can be provided with commonly available rib heat exchangers, and is therefore especially cost-effective.

Additional aspects of the invention relate to a power plant having a gas turbine arrangement of the type outlined.

In such a power plant, the electrical energy provided by the at least one thermoelectric generator during operation can be fed via power electronics, jointly with electrical energy provided during operation by an electric generator driven by the turbine arrangement, into a power network coupled to the power plant, in order to increase the overall efficiency of the power plant and to provide more network energy.

Alternatively, it is also possible that electrical energy provided by the at least one thermoelectric generator during operation can be fed into a power network internal to the power plant for the purpose of supplying consumers assigned to the power plant. This, too, leads to the desired increase in efficiency and has the additional advantage of reducing any possibly existing dependence of the power plant consumers upon external power sources, so that autonomous operation of the power plant becomes possible outside a direct cold starting phase.

Finally, the invention also relates to a method for operating a power plant having a gas turbine arrangement, in which fuel is burnt together with combustion air compressed by means of a compressor and a turbine coupled mechanically to the compressor is driven by means of the combustion gases, the combustion gases being discharged into the surroundings via an exhaust gas tract. According to aspects of the invention, there is in this case provision whereby residual heat from the exhaust gases is converted at least partially into electrical energy by means of at least one thermoelectric generator.

As already explained with regard to the gas turbine arrangement according to aspects of the invention, the overall efficiency of the power plant is thereby increased, so that, for the same output of energy, less fuel is consumed and less $CO_2$ and other pollutants are discharged into the surroundings. Here, too, there are, with regard to feeding in the electrical energy obtained, the possibilities and advantages which have been explained by means of the exemplary embodiments of the power plant according to the invention.

BRIEF DESCRIPTION OF THE DRAWINGS

The invention and its embodiments are explained in more detail below by means of the drawings in which.

DETAILED DESCRIPTION OF THE ILLUSTRATED EMBODIMENTS

Figure 1:
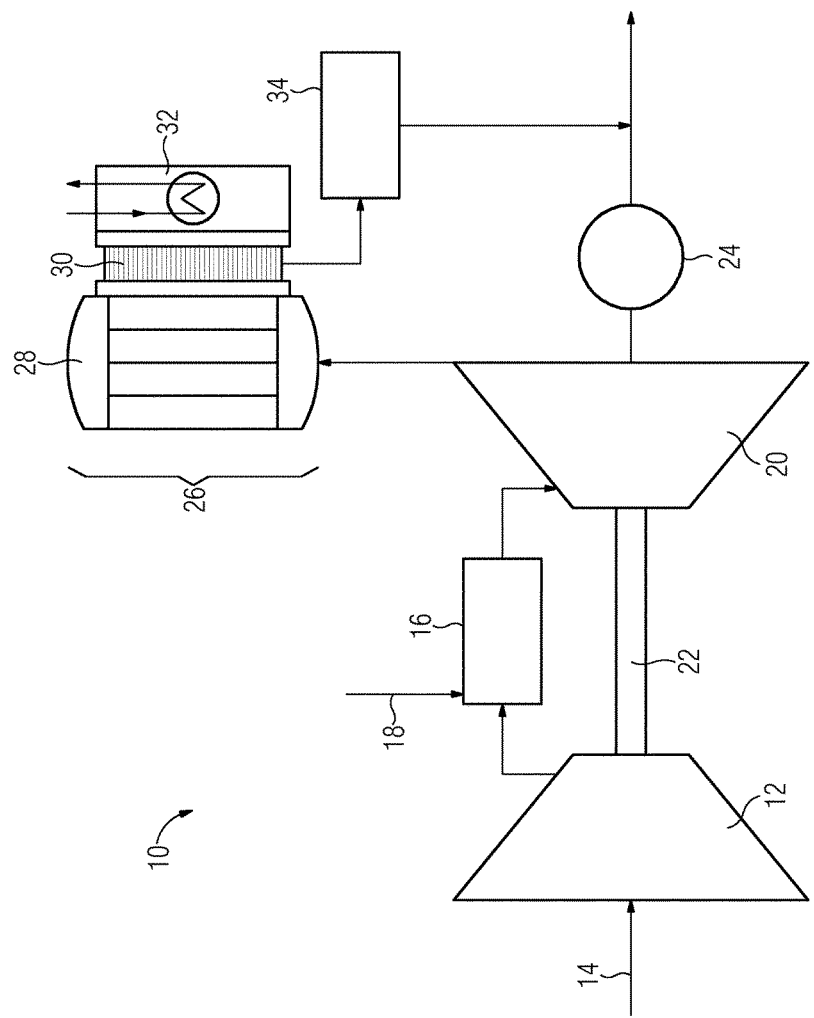
FIG. 1 shows a diagrammatic illustration of an exemplary embodiment of a gas turbine arrangement according to the invention.

A gas turbine arrangement, designated as a whole by reference numeral 10, for a power plant comprises a compressor 12, in which combustion air entering in the direction of the arrow 14 is compressed. Fuel entering in the direction of the arrow 18 is burnt together with the compressed air in a combustion chamber 16, the hot combustion gases being utilized in order to drive a turbine 20. The compressor 12 and turbine 20 are in this case coupled via a common shaft 22, by means of which, furthermore, a generator 24 for generating electrical energy is driven.

After passing through the turbine 20, the combustion gases are discharged into the surroundings via an exhaust gas tract 26 and at the same time where appropriate, also undergo purification. In the exhaust gas tract, a heat exchanger 28 is provided, which is coupled thermally to a coolant line 32 via a thermoelectric generator 30.

Heat energy from the hot combustion gases passes along the gradient between heat exchanger 28 and cooling line 32 through the thermoelectric generator 30, electrical energy being generated by a combination of the Seebeck effect and Peltier effect. The thermoelectric generator 30 is coupled to the exit of the generator 24 via power electronics 34, so that the energy recovered from the waste heat of the combustion gases can be fed, together with the energy generated by the generator 24, into a network.

As a result of waste heat utilization, the efficiency of the gas turbine arrangement 10 can be increased and consequently pollutant emission can be reduced. On account of the rapid start-up characteristic of the thermoelectric generator 30, in this case the flexibility of the gas turbine arrangement in terms of rapid load changes or quick starting processes is not impaired, so that the gas turbine arrangement 10 is suitable especially for peak load and standby power plants.

In the design of the heat exchanger 28 and thermoelectric generator 30, care must be taken to ensure that the components should generate at most a dynamic pressure of 100 mbar and preferably of less than 50 mbar in the exhaust gas tract 26. On account of the exhaust gas temperatures, a thermal load bearing capacity of the thermoelectric generator of 250° C.-450° C. is desirable.

The operating temperature of the thermoelectric generator 30 can in this case be set, in particular, via the configuration of the heat exchanger 28, for example via the ratio of that surface of the heat exchanger 28 which faces the gas stream to the contact surface between the heat exchanger 28 and thermoelectric generator 30.

Figure 2:
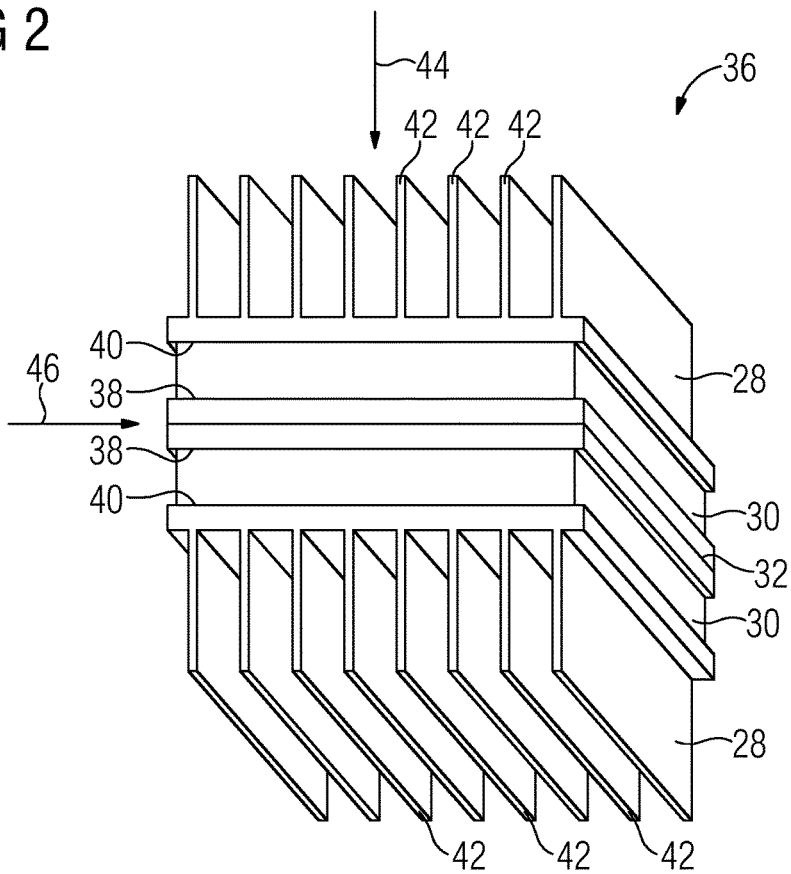
FIG. 2 shows a perspective view of a plate-shaped thermoelectric generator module for an exemplary embodiment to a gas turbine arrangement according to the invention.
Figure 3:
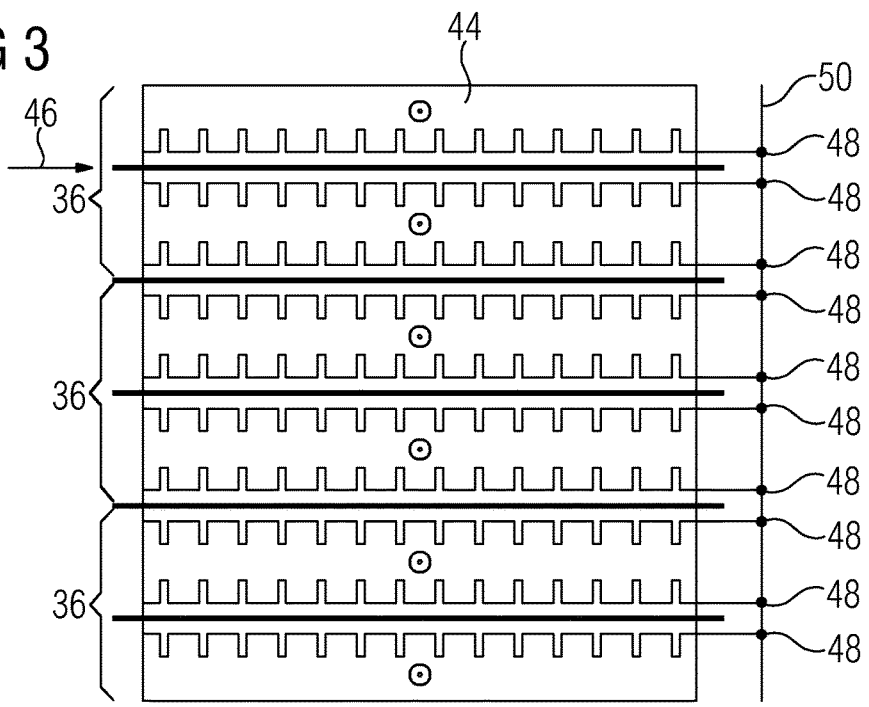
FIG. 3 shows a diagrammatic illustration of a plurality of generator modules according to FIG. 2.

A first exemplary embodiment of a modular unit 36 composed of a heat exchanger 28 and thermoelectric generator 30 is illustrated in FIGS. 2 and 3. The modular unit is designed in a manner of a rib heat exchanger. Two plate-shaped thermoelectric generators surround a central gap-shaped coolant line 32 and are in thermal contact with the latter by means of their cold sides 38. Likewise plate-shaped heat exchangers 28 with a multiplicity of ribs 42 for surface enlargement are arranged on the hot sides 40 of the thermoelectric generators. The combustion gases flow over the modular unit 46 in the direction of the arrow 44, while the coolant flows through the line 32 in the direction of the arrow 46.

A multiplicity of such modular units 36 are connected thermally in parallel and electrically in series in the exhaust gas tract 26, as shown in FIG. 3. Electrical contacting in this case takes place via the individual tapping poles 48 of the thermoelectric generators 30 by means of a common line 50. In the illustration shown, the gas flow runs perpendicularly to the paper plane.

A plurality of modular units 36 may also be arranged one behind the other in the direction of the gas flow. Modular units 36 positioned in front in the flow direction in this case cool the gas stream already, so that modular units 36 positioned further to the rear experience a lower temperature gradient across the thermoelectric generator 30. This can be compensated by the configuration of the heat exchangers 28, for example by the number, thickness and area of the ribs 42.

For waste heat utilization in the exhaust gas temperature range of 570° C.-230° C. by means of continuously arranged modular units 36, the thermoelectric generators 30 of which have a maximum operating temperature of 230° C., what is obtained, for example, for a rib height of 2 cm and a rib thickness of 1 mm is a surface ratio between the gas-side surface of the heat exchangers 28 and the hot side 40 of the thermoelectric generators 30 of about 12.

If, by contrast, strip-shaped modular units 36 are used, of which the length in the flow direction amounts to 8 cm and which are decoupled thermally, what is obtained for the modular units 36 arranged on the side of the entry of gas into the exhaust gas tract 26 is a surface ratio of 5. At the average temperature, that is to say further downstream in the flow direction, a surface ratio of 12 is obtained again. Since, in this variant, there is no need to transport heat axially in order to equalize the temperature of the thermoelectric generators, moreover, material can be saved, and therefore this variant is especially beneficial in terms of investment.

Figure 4:
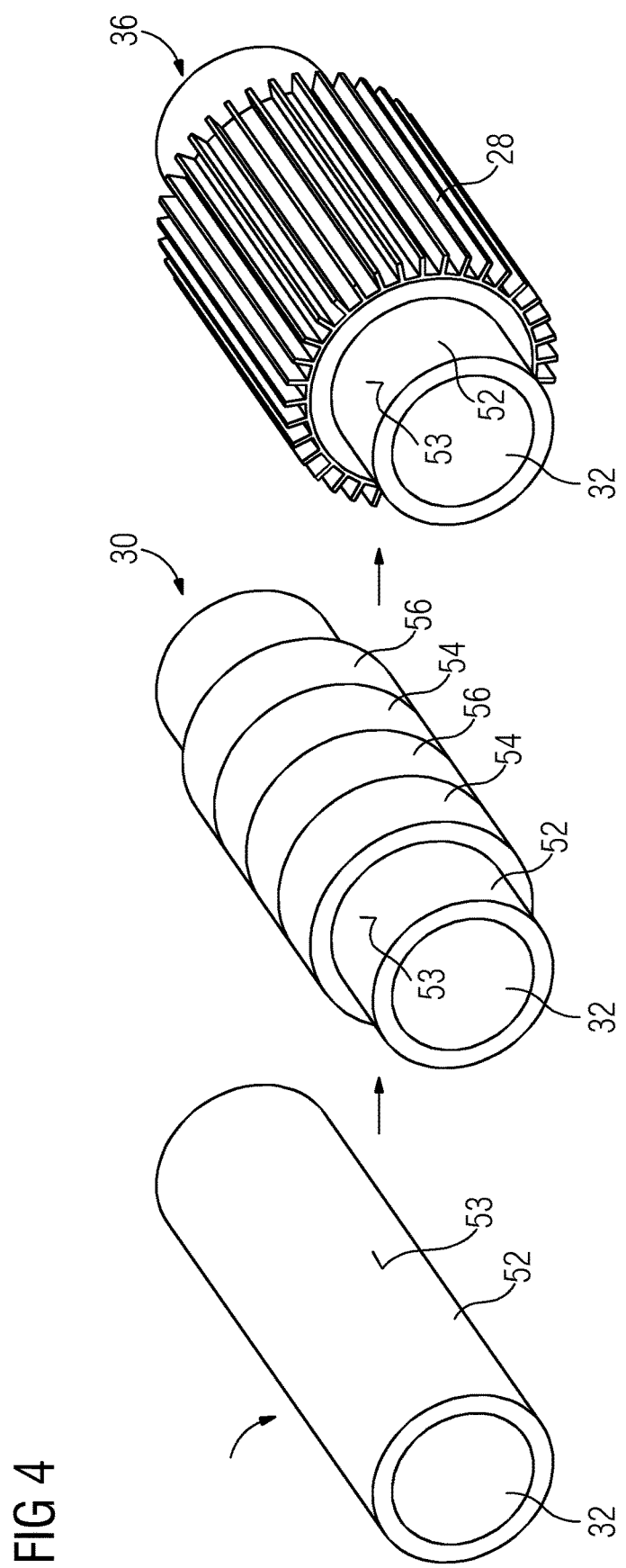
FIG. 4 shows a diagrammatic illustration of the manufacturing steps in the production of a tubular thermoelectric generator module for an exemplary embodiment of a gas turbine arrangement according to the invention.
Figure 5:
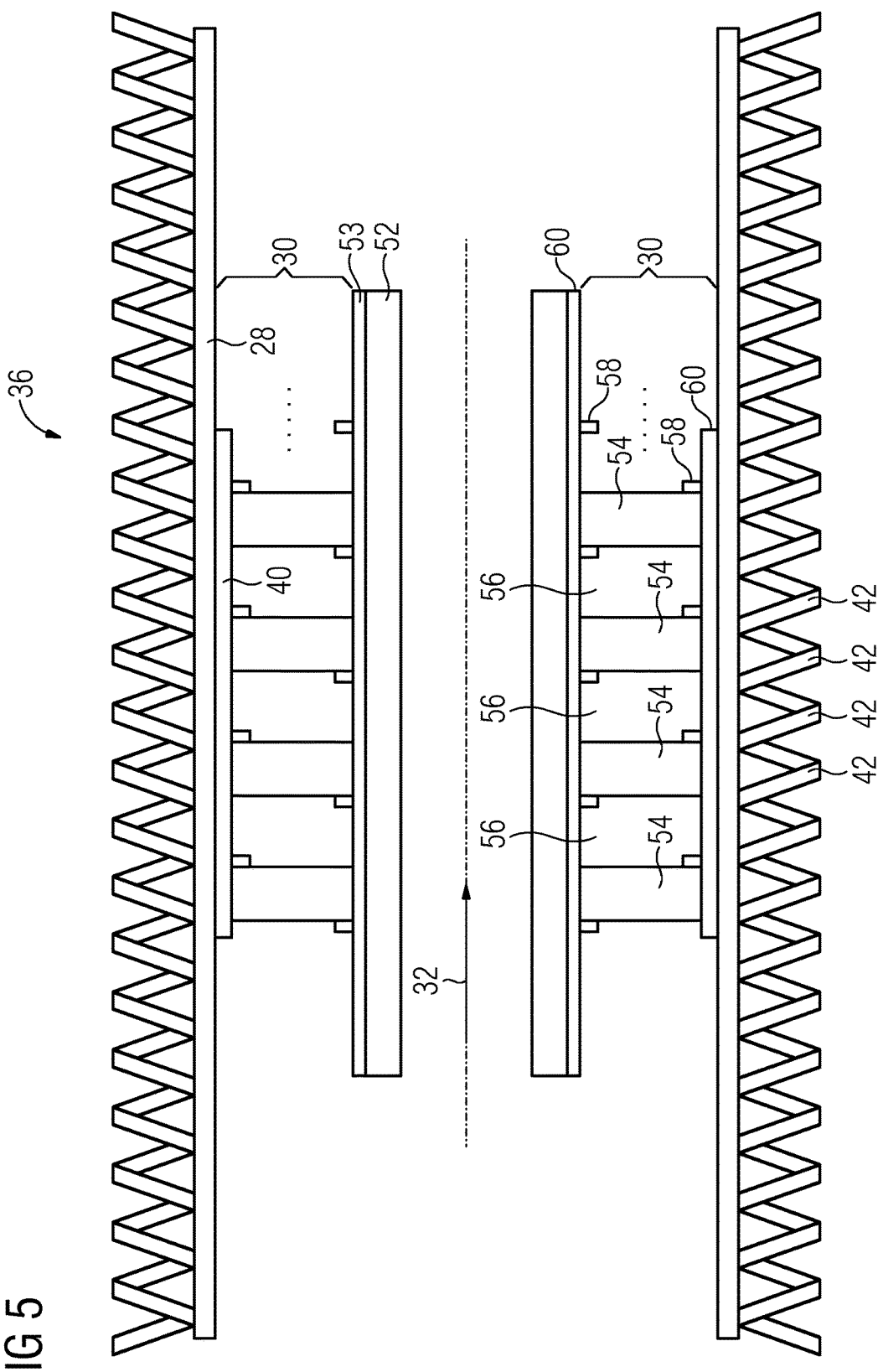
FIG. 5 shows a sectional illustration through a thermoelectric generator module according to FIG. 4.

Finally, FIGS. 4 and 5 show an alternative embodiment of the modular unit 36 which is designed in a manner of a tube heat exchanger. The flow duct 32 for the cooling medium is formed here by a cylindrical tube 52, to the outer surface 53 of which alternating rings 54, 56 composed of p-doped and n-doped semiconductors are applied in order to form the thermoelectric generator 30. This may take place, for example, by means of a spraying method. Finally, the heat exchanger 28 is applied to the outer surface 40 of the thermoelectric generator.

Metallic connecting rings 58 in this case ensure the electrical contacting of the p-doped and n-doped rings 54, 56, while the semiconductor is electrically insulated with respect to the tube 52 and to the heat exchanger 28 by insulating layers 60. The continuous connection between tube 52, thermoelectric generator 30 and heat exchanger 28 affords an especially stable modular unit 36 which can easily be integrated into the infrastructure of existing gas turbine power plants instead of conventional waste heat steam generators.

The invention claimed is:

1. A gas turbine arrangement for a power plant, comprising:
   a compressor for compression of combustion air, which compressor is coupled by a shaft to a turbine which can be driven by combustion gases, the combustion gases being capable of being generated by combustion of fuel with the compressed combustion air;
   an exhaust gas tract by which the combustion gases, after passing through the turbine, are discharged into the surroundings;
   at least one thermoelectric generator for generating electrical energy from residual heat of the combustion gases in the exhaust gas tract, and
   at least one heat transmission unit that is thermally coupled to the at least one thermoelectric generator,
   wherein a heat conductivity on a surface of the heat transmission element which protrudes into the exhaust gas tract is lower than the heat conductivity on a side of the heat transmission element which faces the at least one thermoelectric generator.

2. The gas turbine arrangement as claimed in claim 1, wherein the at least one thermoelectric generator comprises a cold side that faces a coolant line.

3. The gas turbine arrangement as claimed in claim 1, comprising a plurality of thermoelectric generators, which are arranged one behind the other in the flow direction of the combustion gases.

4. The gas turbine arrangement as claimed in claim 3, wherein the thermoelectric generators are decoupled thermally from one another.

5. The gas turbine arrangement as claimed in claim 3, wherein for thermoelectric generators which are in each case adjacent, the thermoelectric generator in front in the flow direction has a lower ratio between that surface of a respective heat transmission element which faces the gas stream and the surface of the hot side of the thermoelectric generator than the thermoelectric generator at the rear in the flow direction.

6. The gas turbine arrangement as claimed in claim 2, wherein the at least one thermoelectric generator surrounds the coolant line on the outer circumference.

7. The gas turbine arrangement as claimed in claim 6, wherein the thermoelectric generator is arranged on the outer circumferential surface of a coolant line having a round cross section.

8. The gas turbine arrangement as claimed in claim 6, wherein the coolant line is designed as a gap between opposite pairs of plate-shaped thermoelectric generators.

9. A power plant having a gas turbine arrangement as claimed in claim 1.

10. The power plant as claimed in claim 9, wherein electrical energy provided by the at least one thermoelectric generator during operation can be fed via power electronics, jointly with electrical energy provided during operation by an electric generator driven by the turbine arrangement, into a power network coupled to the power plant.

11. The power plant as claimed in claim 9, wherein electrical energy provided by the at least one thermoelectric generator during operation can be fed into a power network internal to the power plant for the purpose of supplying consumers assigned to the power plant.

12. A method for operating a power plant having a gas turbine arrangement, in which fuel is burnt together with combustion air compressed by a compressor and a turbine coupled mechanically to the compressor, the method comprising:
    driving the turbine by way of combustion gases, the combustion gases being discharged into the surroundings via an exhaust gas tract;
    converting residual heat from the exhaust gases at least partially into electrical energy by way of at least one thermoelectric generator,
    wherein the at least one thermoelectric generator is in thermal communication with a heat transmission unit that is in thermal communication with the exhaust gases, and
    wherein a heat conductivity on a surface of the heat transmission element which protrudes into the exhaust gas tract is lower than the heat conductivity on a side of the heat transmission element which faces the at least one thermoelectric generator.

13. The method as claimed in claim 12, wherein the electrical energy generated by the at least one thermoelectric generator is fed, together with energy generated by a generator driven by the turbine arrangement, into a power network.

14. The method as claimed in claim 12, wherein the electrical energy generated by the at least one thermoelectric generator is used for supplying consumers internal to the power plant.

15. A gas turbine arrangement for a power plant, comprising:
    a compressor coupled by a shaft to a turbine;
    an exhaust gas tract configured to provide fluid communication between the turbine and the surroundings for combustion gases;
    an upstream thermoelectric generator in thermal communication with relatively upstream combustion gases;
    an upstream heat transmission element in thermal communication with the upstream thermoelectric generator and comprising an upstream element gas surface that faces the combustion gases and an upstream element generator surface that faces the hot side of the thermoelectric generator, wherein the upstream heat transmission element is characterized by an upstream element ratio between the upstream element gas surface and the upstream element generator surface;
    a downstream thermoelectric generator in thermal communication with relatively downstream combustion gases; and
    a downstream heat transmission element in thermal communication with the downstream thermoelectric generator and comprising a downstream element gas surface that faces the combustion gases and a downstream element generator surface that faces the hot side of the thermoelectric generator, wherein the downstream heat transmission element is characterized by a downstream element ratio between the downstream element gas surface and the downstream element generator surface;
    wherein the upstream element ratio is lower than the downstream element ratio.

* * * * *

UNITED STATES PATENT AND TRADEMARK OFFICE
CERTIFICATE OF CORRECTION

| | |
|---|---|
| PATENT NO. | : 9,806,247 B2 |
| APPLICATION NO. | : 14/236555 |
| DATED | : October 31, 2017 |
| INVENTOR(S) | : Thomas Hammer et al. |

It is certified that error appears in the above-identified patent and that said Letters Patent is hereby corrected as shown below:

Column 6, Claim 1, Line 26, remove [for a power plant];

Column 6, Claim 1, Lines 29 and 30, remove [which can be] and insert --configured to be--;

Column 6, Claim 1, Line 40, remove [at least one] and insert --a--;

Column 6, Claim 1, Line 40, remove [unit] and insert --element--;

Column 6, Claim 1, Line 42, insert paragraph --wherein a hot gas surface of the heat transmission element facing the exhaust gas tract is configured to form a boundary layer in the combustion gases between the hot gas surface and free flowing combustion gases, and--;

Column 6, Claim 1, Line 42, after the word "wherein", insert --the boundary layer causes--;

Column 6, Claim 1, Line 42, before the word "surface", remove [a] and insert --the hot gas--;

Column 6, Claim 1, Lines 42 and 43, remove [of the heat transmission element which protrudes into] and insert --facing--;

Column 6, Claim 1, Line 44, remove [is] and insert --to be--;

Column 6, Claim 3, Line 52, before the words "flow direction", remove [the] and insert --a--;

Column 6, Claim 4, Line 55, before the word "thermoelectric", insert --plurality of--;

Column 6, Claim 5, Line 59, before the word "thermoelectric" remove [the] and insert --a--;

Column 6, Claim 5, Line 61, remove [gas stream] and insert --exhaust gas tract--;

Column 6, Claim 5, Line 62, after the word "surface", remove [of the] and insert --that faces a--;

Signed and Sealed this
Fourth Day of September, 2018

Andrei Iancu
*Director of the United States Patent and Trademark Office*

CERTIFICATE OF CORRECTION (continued)
U.S. Pat. No. 9,806,247 B2

Column 6, Claim 5, Line 63, before the word "thermoelectric", remove [the] and insert --a--;

Column 6, Claim 6, Line 67, before the words "outer circumference", remove [the] and insert --an--;

Column 7, Claim 7, Line 2, before the words "outer circumferential", remove [the] and insert --an--;

Column 7, Claim 10, Line 12, remove [can be] and insert --is--;

Column 7, Claim 11, Line 18, remove [can be] and insert --is--;

Column 7, Claim 11, Line 19, remove [the purpose of];

Column 7, Claim 12, Line 29, remove [exhaust] and insert --combustion--;

Column 7, Claim 12, Line 33, remove [unit] and insert --element--;

Column 7, Claim 12, Line 34, remove [exhaust] and insert --combustion--;

Column 7, Claim 12, Line 35, remove [and] and insert new paragraph --wherein a hot gas surface of the heat transmission element facing the exhaust gas tract is configured to form a boundary layer in the combustion gases between the hot gas surface and free flowing combustion gases, and--;

Column 7, Claim 12, Line 36, after the word "wherein", insert --the boundary layer causes--;

Column 7, Claim 12, Line 36, before the word "surface", remove [a] and insert --the hot gas--;

Column 7, Claim 12, Lines 36 and 37, remove [of the heat transmission element which protrudes into] and insert --facing--;

Column 7, Claim 12, Line 38, remove [is] and insert --to be--;

Column 8, Claim 13, Line 4, before the word "turbine" insert --gas--;

Column 8, Claim 15, Line 25, after the words "gas surface" insert --contact area--;

Column 8, Claim 15, Line 26, after the words "generator surface" insert --hot surface area--;

Column 8, Claim 15, Lines 38 and 39, after the words "gas surface" insert --contact area--.